United States Patent
Hong et al.

(10) Patent No.: US 10,222,414 B2
(45) Date of Patent: Mar. 5, 2019

(54) APPARATUS AND METHOD FOR EXCHANGING PROBE

(71) Applicant: SAMSUNG ELECTRONICS CO., LTD., Suwon-si, Gyeonggi-do (KR)

(72) Inventors: Jae Wan Hong, Seoul (KR); Jeong Hoi Kim, Suwon-si (KR); Yu Sin Yang, Seocho-gu (KR); Sang Kil Lee, Yongin-si (KR); Chung Sam Jun, Suwon-si (KR)

(73) Assignees: SAMSUNG ELECTRONICS CO., LTD., Suwon-si, Gyeonggi-Do (KR); NANOFOCUS INC., Seoul (KR)

( * ) Notice: Subject to any disclaimer, the term of this patent is extended or adjusted under 35 U.S.C. 154(b) by 218 days.

(21) Appl. No.: 15/286,626

(22) Filed: Oct. 6, 2016

(65) Prior Publication Data
US 2017/0160341 A1 Jun. 8, 2017

(30) Foreign Application Priority Data
Dec. 7, 2015 (KR) .......... 10-2015-0173123

(51) Int. Cl.
*G01R 31/28* (2006.01)
*G01R 1/04* (2006.01)

(52) U.S. Cl.
CPC ....... *G01R 31/2891* (2013.01); *G01R 1/0416* (2013.01)

(58) Field of Classification Search
CPC ........ G01N 27/04; G01N 27/02; G01N 27/06; G01N 33/18; G01N 27/045
USPC .................. 324/693, 600, 649, 691
See application file for complete search history.

(56) References Cited

U.S. PATENT DOCUMENTS

| 5,705,814 | A | | 1/1998 | Young et al. |
| 6,009,421 | A | * | 12/1999 | Xie .......... G06F 11/25 706/61 |
| 6,093,930 | A | | 7/2000 | Boyette, Jr. et al. |
| 6,435,015 | B1 | | 8/2002 | Yamamoto |
| 6,507,832 | B1 | * | 1/2003 | Evans ........ G06F 11/25 702/182 |
| 6,617,972 | B2 | * | 9/2003 | Takarada ...... G08B 21/0484 324/538 |
| 7,381,971 | B2 | | 6/2008 | Moore et al. |
| 7,709,791 | B2 | | 5/2010 | Jo et al. |

(Continued)

FOREIGN PATENT DOCUMENTS

| EP | 2 667 147 A1 | 11/2013 |
| EP | 2 667 152 A1 | 11/2013 |

(Continued)

*Primary Examiner* — Giovanni Astacio-Oquendo
(74) *Attorney, Agent, or Firm* — F. Chau & Associates, LLC

(57) ABSTRACT

An apparatus for exchanging a probe includes a stacker configured to receive a probe and to align the probe, a probe connector connected to the probe, and a laser alignment unit including a light emitter and a light receiver. The light emitter is configured to emit a laser beam to the probe, and the light receiver is configured to detect the laser beam reflected by the probe. The laser alignment unit is configured to detect when the probe is properly aligned on the probe connector using the light receiver, and the laser alignment unit is configured to stop moving the stacker when it is detected that the probe is properly aligned.

20 Claims, 15 Drawing Sheets

(56) References Cited

U.S. PATENT DOCUMENTS

| | | | |
|---|---|---|---|
| 8,099,793 B2 | 1/2012 | Jo et al. | |
| 8,736,817 B2 | 5/2014 | Jones et al. | |
| 8,779,729 B2* | 7/2014 | Shiraishi | G01R 31/3606 320/155 |
| 8,817,240 B2 | 8/2014 | Jones et al. | |
| 9,115,982 B2 | 8/2015 | Jones et al. | |
| 2008/0018993 A1 | 1/2008 | Sulzbach et al. | |
| 2010/0282276 A1* | 11/2010 | Kueper | B24B 7/06 134/6 |
| 2012/0098518 A1* | 4/2012 | Unagami | G01R 22/066 324/74 |

FOREIGN PATENT DOCUMENTS

| | | |
|---|---|---|
| JP | 2004-085387 | 3/2004 |
| JP | 2005-308406 | 11/2005 |
| JP | 3780028 | 3/2006 |
| JP | 5014174 | 6/2012 |
| JP | 2013-246172 | 12/2013 |
| KR | 10-0825985 B1 | 4/2008 |

* cited by examiner

APPARATUS AND METHOD FOR EXCHANGING PROBE

CROSS-REFERENCE TO RELATED APPLICATION

This application claims priority under 35 U.S.C. § 119 to Korean Patent Application No. 10-2015-0173123, filed on Dec. 7, 2015, in the Korean Intellectual Property Office, the content of which is incorporated by reference herein in its entirety.

TECHNICAL FIELD

The present inventive concept relates to an apparatus and a method for exchanging a probe.

DISCUSSION OF THE RELATED ART

As the size of semiconductor chips decreases and the interior structure of the semiconductor chip becomes more complex, measurement devices that use probes are becoming more common. The measurement devices that use probes may be used to determine various properties of fabricated semiconductor devices. Different types of probes may be used to determine the properties of different semiconductor devices.

SUMMARY

According an exemplary embodiment of the present inventive concept, an apparatus is used for exchanging a probe accurately and efficiently.

According an exemplary embodiment of the present inventive concept, a method for exchanging a probe can be used to accurately and efficiently replace a probe.

According to an exemplary embodiment of the present inventive concept, an apparatus for exchanging a probe includes a stacker configured to receive a probe and to align the probe, a probe connector connected to the probe, and a laser alignment unit including a light emitter and a light receiver. The light emitter is configured to emit a laser beam to the probe, and the light receiver is configured to detect the laser beam reflected by the probe. The laser alignment unit is configured to detect when the probe is properly aligned on the probe connector using the light receiver, and the laser alignment unit is configured to stop moving the stacker when it is detected that the probe is properly aligned.

According to an exemplary embodiment of the present inventive concept, an apparatus for exchanging a probe includes a stage configured to move in at least one direction. A stacker is fixed on the stage, the stacker including an upper surface. The upper surface of the stacker includes a stepped portion. The stepped portion is configured to contact a probe. A probe connector is connected to the probe. A laser alignment unit is configured to direct a laser beam to the probe. The laser alignment unit is further configured to detect the laser beam reflected by the probe. The detected laser beam is used to determine a location of the probe. The stage is configured to align the probe by moving the stage in the at least one direction using the detected laser beam. Moving the stage in the at least one direction causes the stepped portion to push the probe.

According to an exemplary embodiment of the present inventive concept, an apparatus for exchanging a probe includes a stage, a stacker disposed on the stage, a camera, a laser alignment unit, and a probe connector configured to receive a probe thereon. The probe connector is further configured to allow the probe to move thereon. The probe is movable to a predetermined location on the probe connector by moving either the stage or the probe connector, based on an image acquired by the camera or a laser measurement determined using the laser alignment unit.

BRIEF DESCRIPTION OF THE DRAWINGS

The above and other features and aspects of the present inventive concept will become more apparent by describing in detail exemplary embodiments thereof with reference to the accompanying drawings, in which.

DETAILED DESCRIPTION OF THE EMBODIMENTS

Figure 1:
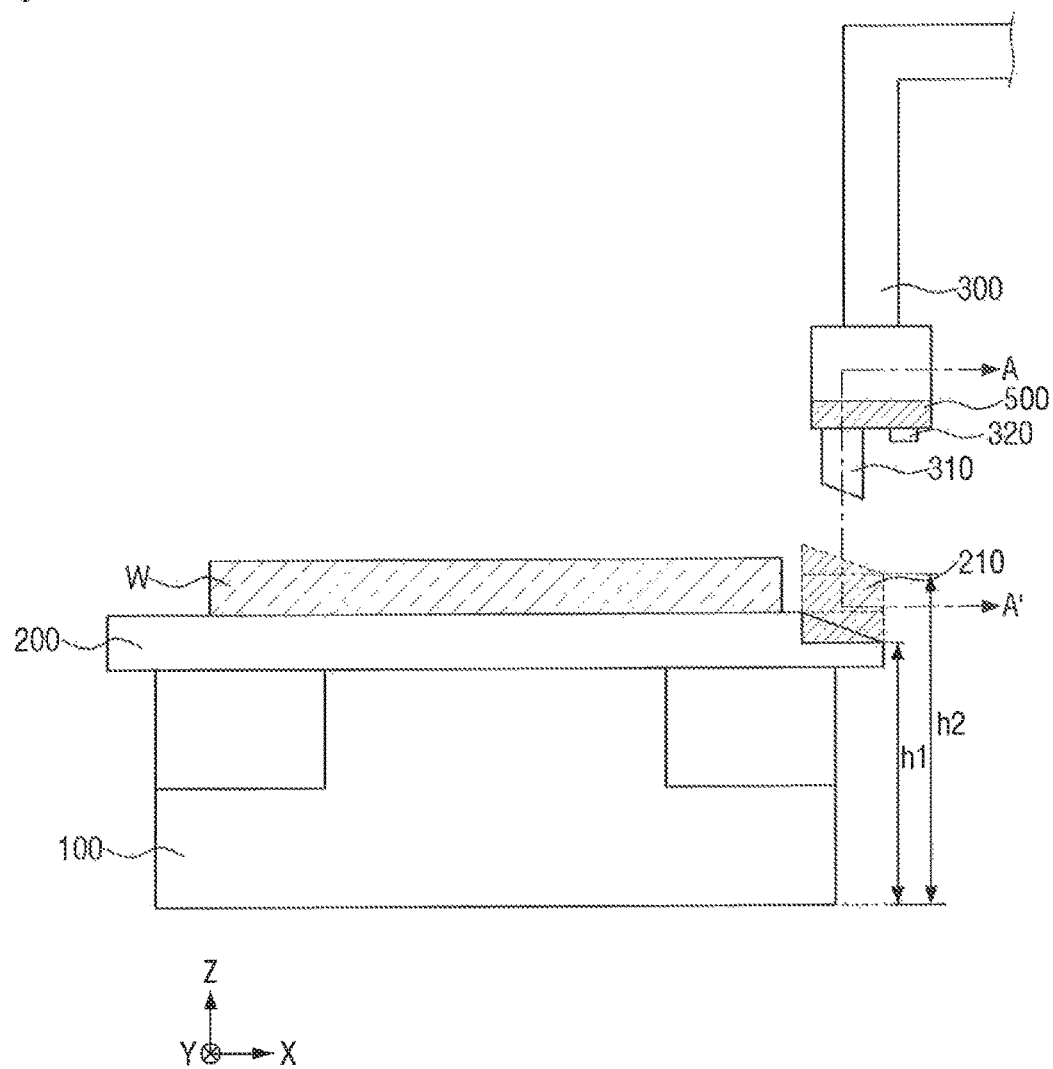
FIG. 1 is a side view of a probe exchanging apparatus, according an exemplary embodiment of the present inventive concept.

Exemplary embodiments of the present inventive concept will now be described more fully hereinafter with reference to the accompanying drawings. The present inventive concept may, however, be embodied in different forms and should not be construed as limited to the embodiments set forth herein. Like reference numerals may refer to like elements throughout the specification. In the drawings, the thicknesses of layers and regions may be exaggerated for clarity.

It will be understood that when an element or layer is referred to as being "connected to," or "coupled to" another element or layer, the element may be directly connected to or coupled to another element or layer or intervening elements or layers may be present. As used herein, the term "and/or" may include any and all combinations of one or more of the associated listed items.

It will also be understood that when a layer is referred to as being "on" another layer or substrate, the layer may be directly on the other layer or substrate, or intervening layers may also be present.

The use of the terms "a" and "an" and "the" and similar referents may be construed to cover both the singular and the plural, unless the context clearly indicates otherwise.

Hereinafter, a probe exchanging apparatus will be described with reference to FIGS. 1 to 9, according to an exemplary embodiment of the present inventive concept.

Figure 2:
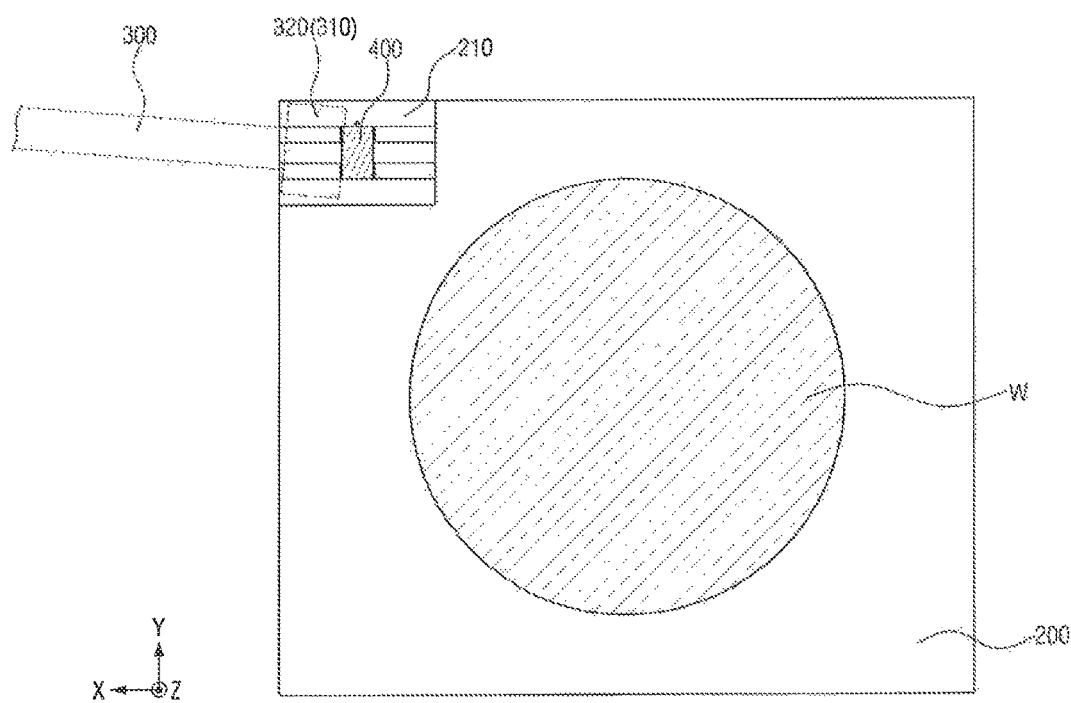
FIG. 2 is a top view of the probe exchanging apparatus of FIG. 1, according an exemplary embodiment of the present inventive concept.

FIG. 1 is a side view of a probe exchanging apparatus, according an exemplary embodiment of the present inventive concept. FIG. 2 is a top view of the probe exchanging apparatus of FIG. 1, according an exemplary embodiment of the present inventive concept.

Referring to FIGS. 1 and 2, a probe exchanging apparatus, according an exemplary embodiment of the present inventive concept, includes a stage 100, a plate 200, a stacker 210, a probe arm 300, a probe connector 310, a camera 320, and a laser alignment unit 500.

The stage 100 may include an upper surface wide enough to support various objects thereon. The plate 200, the stacker 210, and other objects, may be disposed on the stage 100. For example, the plate 200, the stacker 210, and, optionally, the other objects may be disposed on the upper surface of the stage 100 and stacked in a vertical direction. The vertical direction may be referred to as a Z direction.

The stage 100 may cause the objects disposed thereon to be moved when the stage 100 is moved. For example, the objects disposed on the stage 100 move together with the stage 100 when the stage 100 is moved. The stage 100 may move in at least one direction, for example, the stage 100 may move in a horizontal direction. However, exemplary embodiments of the present inventive concept are not limited thereto. The stage 100 may move in a horizontal plane, the horizontal plane being defined by X and Y directions, (e.g., directions that are orthogonal to each other). Each of the X and Y directions may be referred to as a horizontal direction. In addition, each of the X and Y directions is orthogonal to the Z direction. An object disposed on the stage 100 may be aligned to a desired horizontal position by moving the stage 100 in the horizontal plane prior to the placement of the object.

An upper surface of the stage 100 may be moved (e.g., ascended or descended) in the vertical direction (e.g., the Z direction). The upper surface of the stage 100 may, for example, be ascended so that the object on the stage 100 is moved in the Z direction.

Accordingly, the stage 100 may align the objects disposed thereon in three directions (e.g., the X, Y and Z directions) which are orthogonal to each other.

The plate 200 may be disposed on the upper surface of the stage 100. The plate 200 may receive additional objects on an upper surface of the plate 200. The plate 200 may be configured to rotate the additional objects disposed thereon or to receive the additional objects safely thereon. According an exemplary embodiment of the present inventive concept, the plate 200 may be omitted. When the plate 200 is omitted, the objects that would have been disposed on the upper surface of the plate 200 may be disposed on the upper surface of the stage 100.

The position of the plate 200 may change when the stage 100 is driven (e.g., moved). When the stage 100 is moved in a horizontal direction (e.g., in the X and/or Y direction), the plate 200 may be moved together with the stage 100 in the horizontal direction. Such horizontal movement may be done, for example, for alignment purposes. When the stage 100 is moved in the vertical direction (e.g., in the Z direction), the plate 200 may be moved together with the stage 100 in the vertical direction. The stage 100 may be moved in the vertical direction, for example, to bring the plate 200 and/or the stacker 210 closer to or farther from the probe connector 310.

An object such as, for example, a wafer W, may be disposed on the upper surface of the plate 200. However, exemplary embodiments of the present inventive concept are not limited thereto. For example, any object which may be measured using a probe 400 may be disposed on the upper surface of the plate 200. Electrical attributes and/or physical dimensions of the wafer W may be measured using a probe 400. It is understood the probe 400 can be used to measure the electrical attributes and/or physical dimensions of objects other than the wafer W.

The stacker 210 may be disposed on a corner of the plate 200. However, exemplary embodiments of the present inventive concept are not limited thereto. The stacker 210 may be disposed on any other region of the upper surface of the plate 200 that is not overlapped with the object (e.g., the wafer W) disposed on the upper surface of the plate 200. Referring to FIG. 2, the plate 200 may have a square shape and the wafer W may have a circular shape. In this example, the four corners of the plate 200 may include areas where the plate 200 and the wafer W are not overlapped with each other in the vertical direction. However, exemplary embodiments of the present inventive concept are not limited thereto. The shapes of the plate 200 and the wafer W may vary, and the locations of areas of the upper surface of the plate 200 that do not overlap the wafer W may vary.

The stacker 210 may include an inclined upper surface. The inclined upper surface of the stacker 210 may be associated with a manner in which the probe 400 is used to perform measurements.

The stacker 210 may be disposed on the plate 200 and may be ascended in the vertical direction separately from the plate 200. For example, the stacker 200 may be moved up in the Z direction while the plate 200 is not moved up in the Z direction. As illustrated in FIG. 1, the upper surface of the stacker 210 may be ascended from a first height h1 with respect to the stage 100, to a second height h2 with respect to the stage 100. The upper surface of the plate 200 may be disposed at the first height h1 with respect to the stage 100. The second height h2 may be higher in elevation than the upper surface of the plate 200, with respect to the stage 100. As a result, a distance between the probe arm 300 and the stacker 210 may become smaller when the plate 200 is moved from the first height h1 to the second height h2.

The probe arm 300 may be disposed on the stage 100 and the plate 200, at a predetermined distance apart from the stage 100 and the plate 200. This may be done to measure an object disposed on the upper surface of the stage 100 or the plate 200. The probe arm 300 may extend or contract in the horizontal directions X and Y. Further, the probe arm 300 may rotate in a clockwise direction or in a counter-clockwise direction within a given X-Y plane. Accordingly, the probe arm 300 may be used for taking measurements over the entire portion of the stage 100 or the plate 200. In addition, the probe arm 300 may be moved in the vertical direction. As a result, a variety of measuring apparatuses connected to the probe arm 300, such as the probe connector 310 and the laser alignment unit 500, may be disposed closer to the wafer W.

The probe arm 300 may include a first portion and a second portion. The first portion of the probe arm 300 may extend parallel to the stage 100, or parallel to the plate 200. The second portion of the probe arm 300 may be bent from the first portion of the probe arm 300. The second portion of the probe arm 300 may extend in a direction toward the stage 100. The measuring apparatuses, such as the probe connector 310 and the laser alignment unit 500, may be positioned at the second portion of the probe arm 300. However, the described configuration of the probe arm 300 is merely exemplary, and different configurations and/or structures of the probe arm 300 may be formed as needed.

The probe connector 310 may be connected to an end of the second portion of the probe arm 300. The probe 400 may be connected to the probe connector 310. to measure the wafer W. To measure the wafer W, the probe 400 may be brought in contact with, or in proximity to the wafer W. Accordingly, the probe connector 310 may be positioned at a location relatively close to the stage 100 or the plate 200, for example, the probe connector 310 may be spaced apart from the stage 100 or plate 200 by a predetermined distance.

The end of the probe connector 310, which is adjacent to the stacker 200, may be inclined at the same angle as the upper surface of the stacker 210. The end of the probe connector 310, which is adjacent to the stacker 200, may face the stage 100 or the plate 200.

The camera 320 may be connected to the end of the second portion of the probe arm 300, on which the probe connector 310 is disposed. The camera 320 may be disposed on a side surface of the probe connector 310. However, exemplary embodiments of the present inventive concept are not limited thereto. The camera 320 may be installed at any location from which the camera 320 may photograph the probe connector 310 and the probe 400 being connected.

The camera 320 may capture an image showing that the probe 400 and the probe connector 310 are connected and aligned.

The laser alignment unit 500 may be installed at the second portion of the probe arm 300 in which the probe connector 310 is disposed. The laser alignment unit 500 may irradiate the probe 400 with a laser beam. The probe 400 may be connected with the probe connector 310.

The laser alignment unit 500 may detect the laser beam being reflected from the probe 400 to verify whether the probe 400 is aligned on the probe connector 310.

Accordingly, the laser alignment unit 500 may be installed at a position where the laser alignment unit 500 can irradiate the probe 400 with a laser beam.

Figure 3:
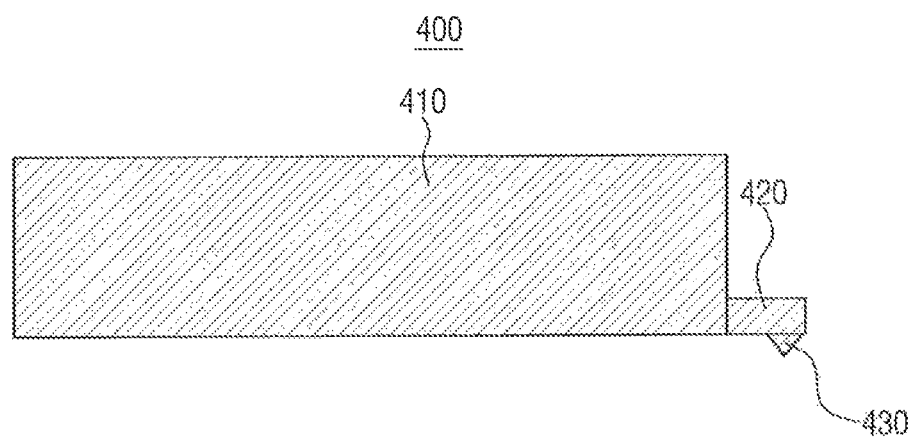
FIG. 3 is a side view of a probe exchanging apparatus, according an exemplary embodiment of the present inventive concept.

FIG. 3 is a side view of a probe exchanging apparatus, according an exemplary embodiment of the present inventive concept.

Referring to FIG. 3, the probe 400 may include a body 410, a cantilever part 420, and a tip 430.

Referring to FIG. 3, the body 410 may occupy most of a volume of the probe 400. The cantilever part 420 may be connected to the body 410, and the cantilever part 420 may be extended from the body 410. The body 410 may support the cantilever part 420 and the tip 430.

The body 410 may be in contact with the stacker 210 and the body 410 may support the weight of the probe 400. The body 410 may be directly connected to the probe connector 310. While the body 410 is illustrated as a hexahedral shape in the drawings, exemplary embodiments of the present inventive concept are not limited thereto. The body 410 may have any shape, as long as the body 410 can be connected with the probe connector 310.

The cantilever part 420 may be cantilevered from the body 410. For example the cantilever part 420 may be cantilevered from a side surface of the body 410. Accordingly, the cantilever part 420 may include a portion thereof in contact with the body 410, and an end thereof that does not contact the body 410. The tip 430 may be disposed on a lower surface of the end of the cantilever part 420 that does not contact the body 410.

The tip 430 may be disposed on a lower surface of the cantilever part 420. The tip 430 may have a shape which tapers to a point in a direction away from the cantilever part 420. The tip 430 may be brought near the wafer W, and the tip 430 may be used, for example, for measuring a height of a pattern on the wafer W. The point of the tip 430 may be lower in elevation than the lower surfaces of the body 410 and the cantilever part 420. The point of the tip 430 may be, for example, closer to the stage 100 than the body 410.

Figure 4:
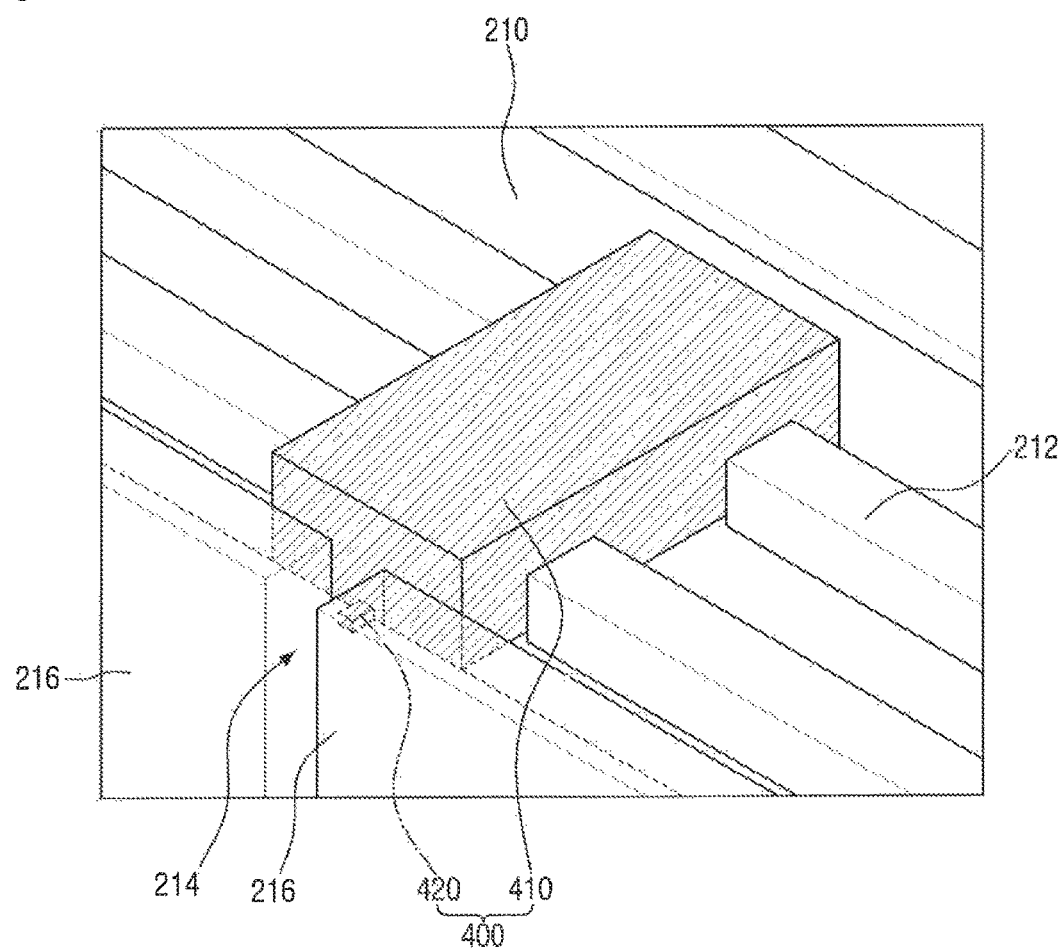
FIG. 4 is a perspective view illustrating a probe mounted on a stacker of a probe exchanging apparatus, according an exemplary embodiment of the present inventive concept.

FIG. 4 is a perspective view illustrating a probe 400 mounted on a stacker 210 of a probe exchanging apparatus, according to an exemplary embodiment of the present inventive concept.

Referring to FIG. 4, the stacker 210 includes a guide pattern 212, a cantilever groove 214, and a supporting wall 216. The guide pattern 212 may protrude from an upper surface of the stacker 210. The upper surface of the guide pattern 212 may be lower in elevation than the upper surface of the probe 400. However, exemplary embodiments of the present inventive concept are not limited thereto. The guide pattern 212 may include a groove in which the probe 400 may be inserted. The probe 400 may be received in the groove and restricted from moving.

As illustrated in FIG. 4, the guide pattern 212 may include a plurality of protrusions that protrude from the upper surface of the stacker 210. However, exemplary embodiments of the present inventive concept are not limited thereto. The guide pattern 212 may, for example, have a shape that surrounds the probe 400. The guide pattern 212 may have any shape, as long as the guide pattern 212 can restrict the movement of the probe 400.

The supporting wall 216 may be in contact with a front surface of the probe 400. The supporting wall 216 may be in contact with, for example, the surface of the probe 400 which the cantilever part 420 cantilevers from. The supporting wall 216 may support the probe 400. Since the upper surface of the stacker 210 is inclined, the probe 400 may also be inclined. The probe 400 may be seated on the inclined upper surface of the stacker 210. Accordingly, the probe 400 may be disposed on the upper surface of the stacker 210, and the probe 400 may press against the supporting wall 216.

The cantilever groove 214 may be formed in a portion of the supporting wall 216 and the stacker 210. The cantilever groove 214 may be a groove where the cantilever part 420 of the probe 400 is received. The cantilever groove 214 may separate the supporting wall 216 into two parts. For example, the supporting wall 216 may be separated into two parts by the cantilever groove 214, and the cantilever groove 214 may be disposed between the two parts of the supporting wall 216. Since the cantilever part 420 is disposed in the cantilever groove 214, the cantilever part 420 does not support the weight of the probe 400.

The arrangement of the cantilever groove 214 is not limited to the groove shown in FIG. 4. In an exemplary embodiment of the present inventive concept, the cantilever groove 214 may be formed such that the supporting wall 216 is continuous, and the cantilever part 420 is not in contact with the supporting wall 216.

The cantilever groove 214 may also be formed on the upper surface of the supporting wall 216 by extending in a vertical direction. As a result, the probe 400 may be ascended in the vertical direction to be connected with the probe connector 310.

Figure 5:
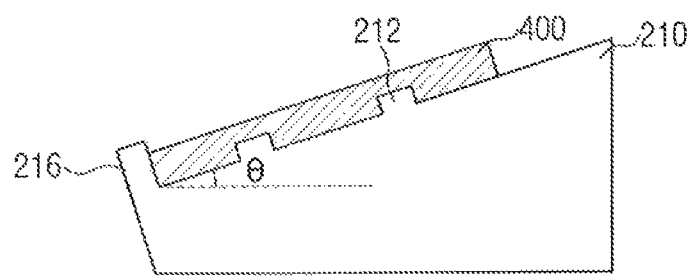
FIG. 5 is a side view illustrating a probe mounted to a stacker of a probe exchanging apparatus, according an exemplary embodiment of the present inventive concept.

FIG. 5 is a side view illustrating the probe 400 mounted to a stacker 210 of a probe exchanging apparatus, according an exemplary embodiment of the present inventive concept.

Referring to FIG. 5, the upper surface of the stacker 210 may be inclined. The upper surface of the stacker 210 may be inclined by a first angle $\theta$ with reference to the horizontal plane. The first angle $\theta$ may be an acute angle. The probe 400 may also be inclined by the first angle $\theta$ on the upper surface of the stacker 210.

The probe 400 may be seated on the inclined upper surface of the stacker 210. Accordingly, the probe 400 may be tilted in the same direction as that of the upper surface of the stacker 210. The supporting wall 216 may support the inclined probe 400. The cantilever part 420 and the tip 430 protruding from the body 410 of the probe 400 may be received in the cantilever groove 214.

The inclining of the upper surface of the stacker 210 may be set accordingly to the desired use of the probe 400. The tip 430, and not the body 410 of the probe 400, is in proximity to the wafer W. It may be necessary that the tip 430 be close to the wafer W to measure the wafer W. In addition, the probe 400 may be connected with the probe connector 310 in an inclined state so that the tip 430 in the lowest vertical level with respect to the cantilever part 420 and body 410.

If the probe 400 is connected with the probe connector 310 while the probe 400 is horizontal, depending on the size and shape of the wafer W, the body 410, instead of the tip 430, may contact the wafer W. In this case, damage may occur to the wafer W or the probe 400. To prevent this, the probe 400 may be in an inclined state when connected with the probe connector 310. As a result of the inclination of the probe 400, the body 410 may be disposed farther away from wafer W than the tip 430.

The guide pattern 212 of the stacker 210 may include a stepped portion protruding from the upper surface of the stacker 210. A height of the guide pattern 212 may be lower than a height of the upper surface of the probe 400. For example, a top surface of the body 410 is located closer to the probe connector 310 than a top surface of the guide pattern 212. This arrangement may prevent the probe connector 310 from contacting the guide pattern 212 and causing damage to the probe connector 310 and/or the guide pattern 212. However, exemplary embodiments of the present inventive concept are not limited thereto.

Figure 6:
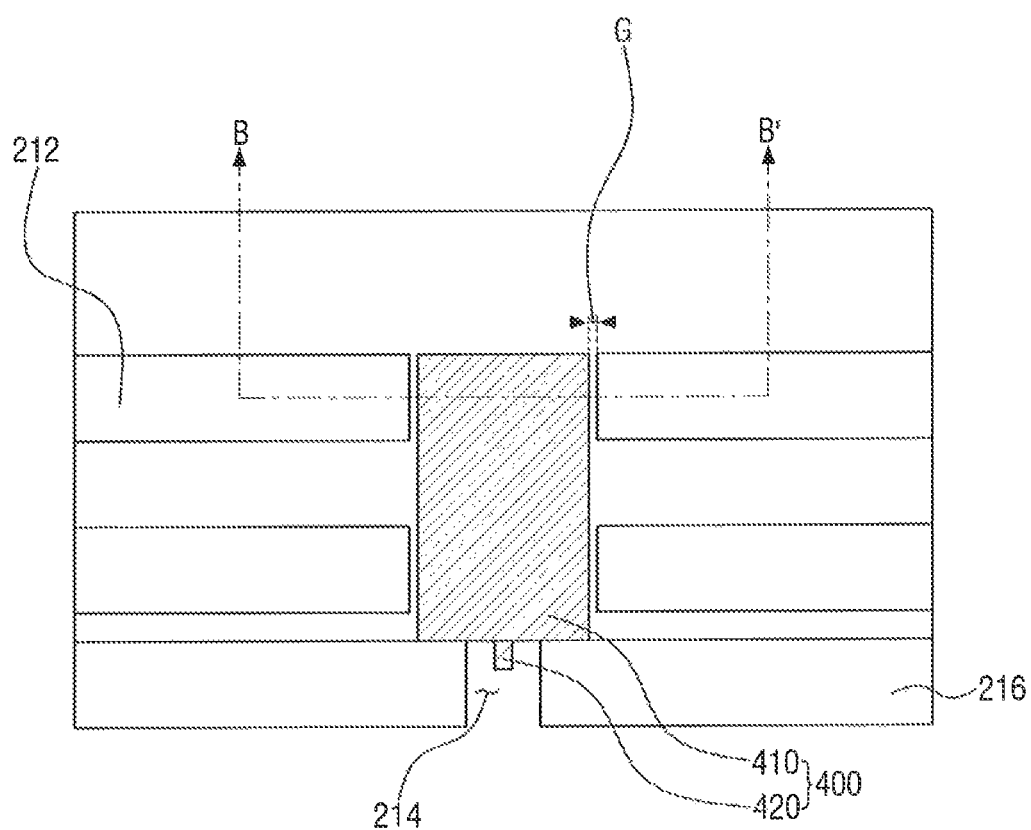
FIG. 6 is a top view illustrating a probe mounted to a stacker of a probe exchanging apparatus, according an exemplary embodiment of the present inventive concept.

FIG. 6 is a top view illustrating a probe 400 mounted to a stacker 210 of a probe exchanging apparatus, according an exemplary embodiment of the present inventive concept.

Referring to FIG. 6, the probe 400 may be disposed in a groove formed in the guide pattern 212. The groove may be, for example, a region of the stacker 210 in which the guide pattern 212 is not formed. In this case, the groove formed in the guide pattern 212 may be larger than a size of the probe 400. For example, a gap G may be formed between the guide pattern 212 and the probe 400. Due to the gap G, damage to the probe 400 may be reduced during a process when the probe 400 is seated on the stacker 210. In addition, due to the gap G, damage to the probe 400 may be prevented when aligning the probe 400 by physical contact with the stacker 210 when the probe 400 is connected (e.g., using suction) to the probe connector 310. In this case, the gap G serves as a space which allows adjustment or movement of the probe 400 on the stacker 210 during the alignment of the probe 400 and the probe connector 310. Accordingly, the probe 400 may be accurately aligned on the probe connector 310, and damage to the probe 400 may be reduced.

A rear surface of the probe 400 (e.g., the surface formed opposite to the surface on which the cantilever part 420 is formed), might not face the guide pattern 212. Accordingly, the probe 400 may be moved in a direction away from the cantilever groove 214 for alignment purposes. However, exemplary embodiments of the present inventive concept are not limited thereto.

In an exemplary embodiment of the present inventive concept, the guide pattern 212 may be formed on the rear surface of the probe 400 such that a gap is formed between the rear surface of the probe 400 and the guide pattern 212, to provide an alignment space for the probe 400.

In an exemplary embodiment of the present inventive concept, unlike the arrangement illustrated in FIG. 6, the guide pattern 212 may surround the side surfaces of the probe 400 by a gap G. Thus, the guide pattern 212 is not limited to any specific shape, as long as it can partially restrict free movement of the probe 400.

The front surface of the probe 400 (e.g., the surface of the probe 400 on which the cantilever part 420 is formed), may be in contact with the supporting wall 216 due to the inclination of the upper surface of the stacker 210. The supporting wall 216 might not be overlapped with the probe 400 in the vertical direction so that the probe 400 is not restricted from moving in the vertical direction.

Figure 7:
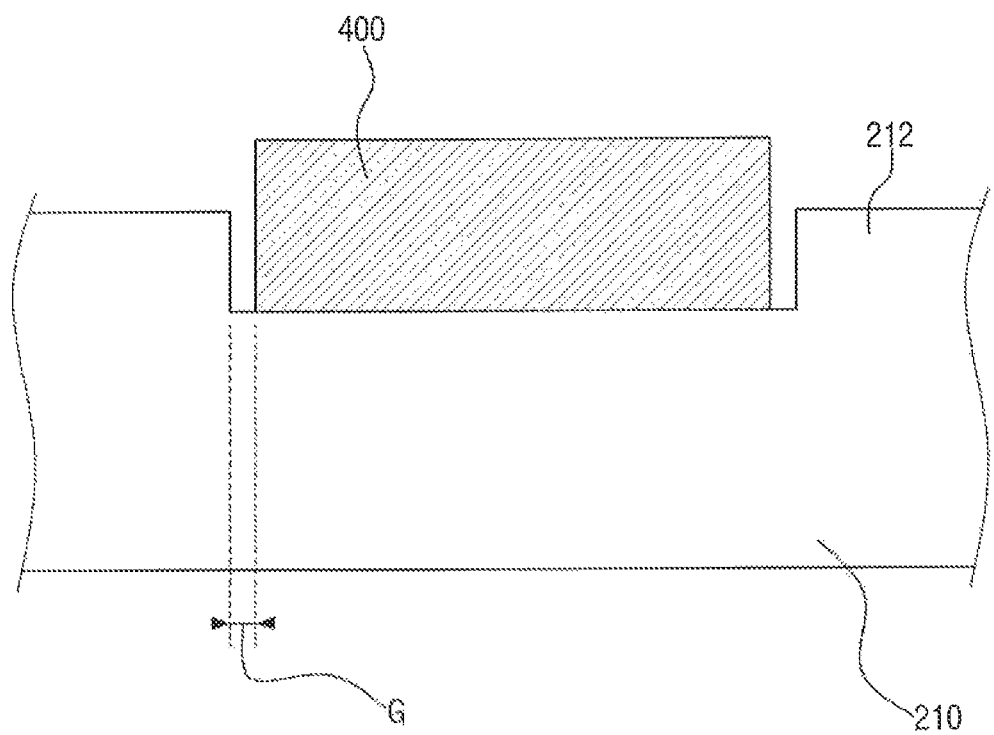
FIG. 7 is a cross sectional view taken along line B-B' of FIG. 6, according an exemplary embodiment of the present inventive concept.

FIG. 7 is a cross sectional view taken along line B-B' of FIG. 6, according an exemplary embodiment of the present inventive concept.

Referring to FIG. 7, the probe 400 may contact the upper surface of the stacker 210 since the stacker 210 supports the weight of the probe 400. The probe 400 might not contact the side surfaces (e.g., vertical surfaces) of the guide pattern 212. For example, the probe 400 may be spaced apart from the side surface of the guide pattern 212 by the gap G.

Although not illustrated in FIG. 7, the stacker 210 may include a first connector. The first connector may be a device that can fix the probe 400 to the stacker 210. The first connector may be, for example, a vacuum hole, a magnet, or a holder. However, exemplary embodiments of the present inventive concept are not limited to the example given above. The case where the first connector is a vacuum hole will be explained in detail below.

A probe exchanging method of a probe exchanging apparatus will be explained with reference to FIGS. 1 and 8 to 18, according to an exemplary embodiment of the present inventive concept.

Figure 10:
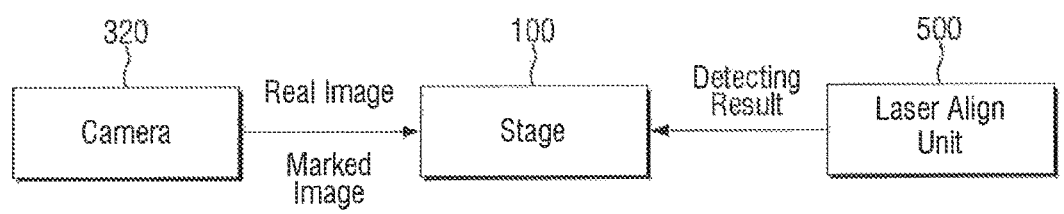
Figure 11:
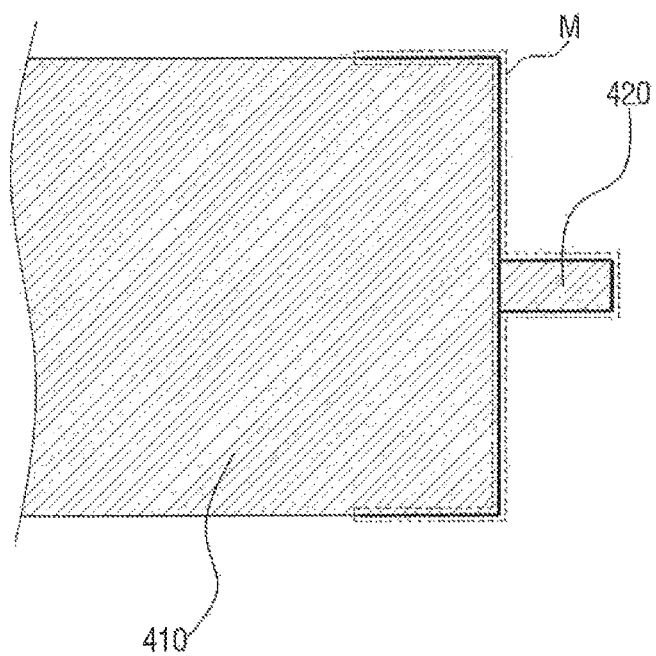

FIGS. 8, 9, and 12 to 14 are cross-sectional views taken along line A-A' of FIG. 1, according to exemplary embodiments of the present inventive concept. FIG. 10 is a block diagram illustrating an operation of the stage 100, according an exemplary embodiment of the present inventive concept. FIG. 11 is a top view of an image of the camera 320, according an exemplary embodiment of the present inventive concept. FIGS. 8, 9, and 12 to 14 omit depiction of the camera 320, the laser alignment unit 500, the supporting wall 216, and the guide pattern 212 for convenience.

Figure 8:
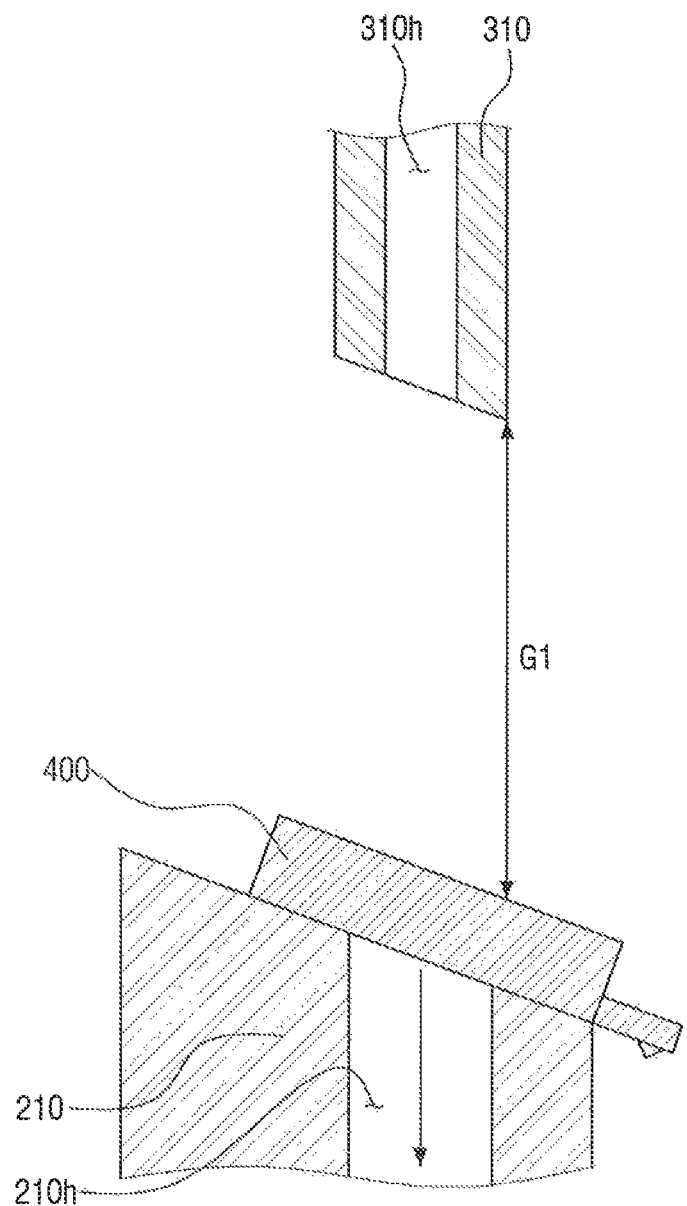
FIGS. 8 to 18 illustrate a probe exchanging method of a probe exchanging apparatus, according to exemplary embodiments of the present inventive concept.

Referring to FIG. 8, the probe 400 is seated on the stacker 210, and the probe connector 310, connected with the probe arm 300, is positioned at a first distance G1 from the probe 400.

The stacker 210 may include a first vacuum hole 210h.

The first vacuum hole 210h may extend through the stacker 210. An end of the first vacuum hole 210h may be in contact with the lower surface of the probe 400, seated on the stacker 210. The first vacuum hole 210h may be entirely covered by the lower surface of the probe 400. The end of the first vacuum hole 210h may be in contact with the body 410 of the probe 400. The body 410 may entirely cover the first vacuum hole 210h with the lower surface of the body 410.

The first vacuum hole 210h may create suction in a downward direction to secure the probe 400 on the stacker 210. For example, the body 410 of the probe 400 may completely block the first vacuum hole 210h so that the probe 400 and the stacker 210 may be fixed to each other. The lower surface of the body 410 may have a larger area than the cross sectional area of the first vacuum hole 210*h* so that the first vacuum hole 210*h* may be entirely covered by the body 410.

The probe connector 310 may include a second vacuum hole 310*h*.

The second vacuum hole 310*h* may pass through the probe connector 310. An end of the second vacuum hole 310*h* may be in contact with the upper surface of the probe 400 when the probe 400 and the probe connector 310 are connected. The end of the second vacuum hole 310*h* may be entirely covered by the upper surface of the probe 400 when the probe 400 and the probe connector 310 are connected. The end of the second vacuum hole 310*h* may be in contact with the body 410 of the probe 400. The body 410 may entirely cover the second vacuum hole 310*h* with the upper surface of the body 410.

The second vacuum hole 310*h* may create suction in an upward direction to secure the probe 400 to the probe connector 310. For example, the body 410 of the probe 400 may completely block the second vacuum hole 310*h* so that the probe 400 and the probe connector 310 may be fixed to each other. The upper surface of the body 410 may have a larger area than the cross sectional area of the second vacuum hole 310*h* so that the second vacuum hole 310*h* may be entirely covered.

Although the first vacuum hole 210*h* and the second vacuum hole 310*h* are illustrated as having different cross-sectional areas from each other, exemplary embodiments of the present inventive concept are not limited thereto. For example, in an exemplary embodiment of the present inventive concept, the first vacuum hole 210*h* and the second vacuum hole 310*h* have the same cross sectional area as each other. In addition, the first vacuum hole 210*h* and the second vacuum hole 310*h* may overlap each other in the vertical direction. As a result, the center portion of the body 410, the first vacuum hole 210*h*, and the second vacuum hole 310*h*, may overlap each other. Thus, the probe 400 may be fastened in a firm and stable manner to the stacker 210 and/or the probe connector 130.

In an exemplary embodiment of the present inventive concept, a different type of connector may be used instead of the first vacuum hole 210*h*. For example, the probe 400 may be fixed using a magnet. The probe 400 may include a metal material, and the metal material allows the probe 400 to be fixed to the stacker 210 using the magnet. In this case, the magnet may be embedded within the stacker 210.

Alternatively, in an exemplary embodiment of the present inventive concept, a holder may be used instead of the first vacuum hole 210*h*. The holder may be a mechanical apparatus that physically presses the probe 400 in a downward direction. The holder may include an elastic material such as spring, and the like. However, exemplary embodiments of the present inventive concept are not limited thereto.

A distance between the probe connector 310 and the probe 400 may be a first distance G1. The distance between the probe connector 310 and the probe 400, as used herein, may refer to a distance between a lowermost portion of the probe connector 310 and the probe 400 in the vertical direction.

Figure 9:
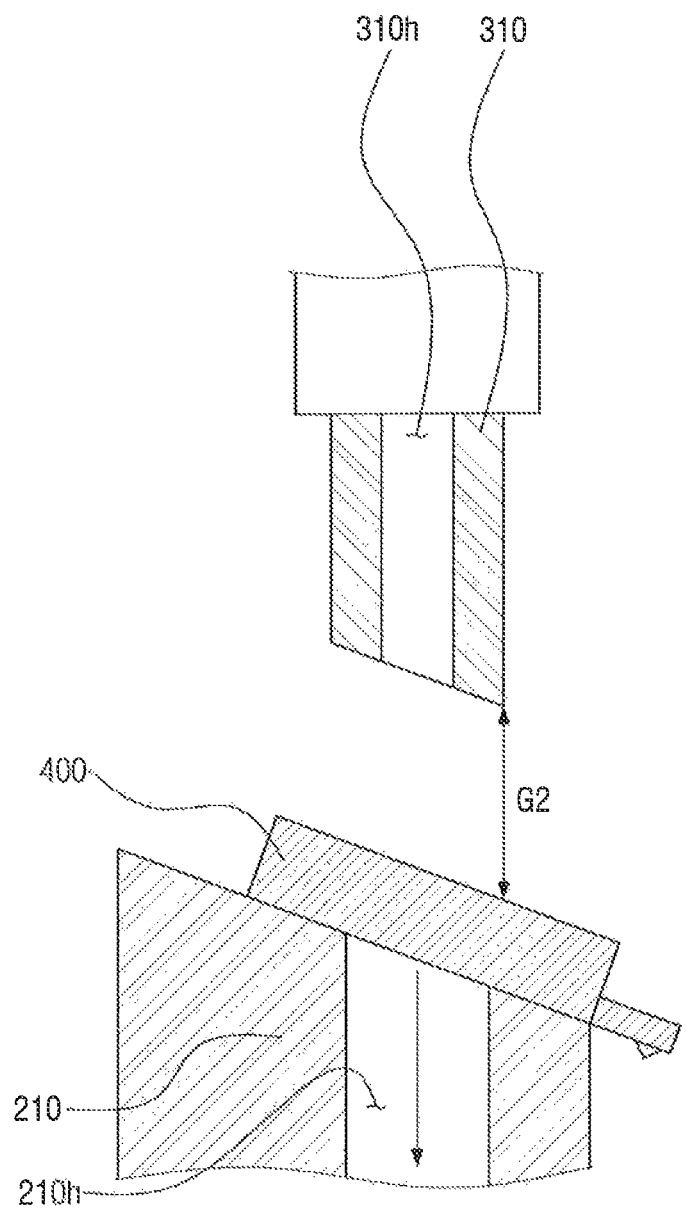

Referring to FIG. 9, the first distance G1 between the probe connector 310 and the probe 400 may be decreased to a second distance G2.

In this case, the second distance G2 may be smaller than the first distance G1.

The first distance G1 may be reduced to the second distance G2 when the stage 100 is ascended.

The stage 100 may move as described above. For example, the stage 100 may be moved in the X, Y and Z directions, and the stage 100 may be rotated about the Z axis.

The upper surface of the stage 100 may be ascended in the vertical direction, for example, the Z direction. For example, the upper surface of the stage 100 may be ascended so that the object (e.g., the wafer W) on the stage 100 is moved in the Z direction.

The stacker 210, disposed on the plate 200, may be ascended in the vertical direction, so the distance between the probe 400 and the probe connector 310 may be decreased from the first distance G1 to the second distance G2.

In an exemplary embodiment of the present inventive concept, instead of the entire upper surface of the stage 100, only a portion (e.g., the portion on which the stacker 200 is disposed) of the upper surface may be ascended. Referring to FIG. 1, only the portion of the plate 200, on the stage 100, where the stacker 210 is disposed might be ascended.

In an exemplary embodiment of the present inventive concept, the upper surface of the plate 200, or the upper surface of the stacker 210 may be ascended, while the stage 100 is not ascended. For example, various elements of the probe exchanging apparatus may be moved, as long as the probe 400 is ascended.

Alternatively, in an exemplary embodiment of the present inventive concept, the probe 400 may be maintained in its current position, and the probe connector 310 may be descended. The probe connector 310 may be moved in the vertical direction. In this case, the probe connector 310 may be moved in a downward direction, reducing the first distance G1 to the second distance G2.

Further, the distance between the probe 400 and the probe connector 310 may be decreased by combining all the methods described above.

Referring to FIGS. 10 and 11, the camera 320 may acquire an image of the probe 400. The camera 320 may acquire the image of the probe 400, for example, in real-time.

Referring to FIG. 10, the camera 320 may acquire the real-time image of the probe 400. A marked image M may include an outline of the probe 400. The camera 320 may overlap the marked image M with the real-time image of the probe 400 acquired by the camera 320.

Referring to FIG. 11, the outer perimeter of the probe 400 in the real-time image acquired by the camera 320 may be overlapped to match the marked image M. The image M may be, for example, etched or physically drawn on the lens of the camera 320. The combined image of the marked image M and the real-time image may be transmitted from the camera 320 to the stage 100.

The stage 100 may align the probe 400 and the probe connector 310 based on the real-time image of the probe 400 including the marked image M. The probe 400 and the probe connector 310 may be accurately aligned with each other when the outer perimeter of the probe 400 in the real-time image is accurately aligned with the marked image M. For example, when the line included in the image M is disposed over the perimeter of the probe 400 of the real-time image, the probe 400 is accurately aligned with the probe connector 310.

The stage 100 may be moved in the horizontal plane (e.g., X and/or Y directions) so that the probe connector 310 and the probe 400 may be accurately aligned with each other based on the real-time image and the marked image M.

In an exemplary embodiment of the present inventive concept, the marked image M may be different from that illustrated in FIG. 11. For example, in FIG. 11, the marked image M illustrates a reference line that conforms to the outline of the body 410 and the cantilever part 420. As an alternative, the marked image M may be a digital image including an outline or silhouette of the probe 400. The outline or silhouette of the probe 400 can be used to align the probe 400 with the probe connector 310.

In an exemplary embodiment of the present inventive concept, the probe arm 300, rather than the stage 100, may be moved. In this case, the camera 320 may transmit the real-time image including the marked image M to the probe arm 300, rather than to the stage 100. When the camera 320 is connected with the probe arm 300, a path of transmission of the real-time image including the marked image M is short and efficient.

Figure 12:
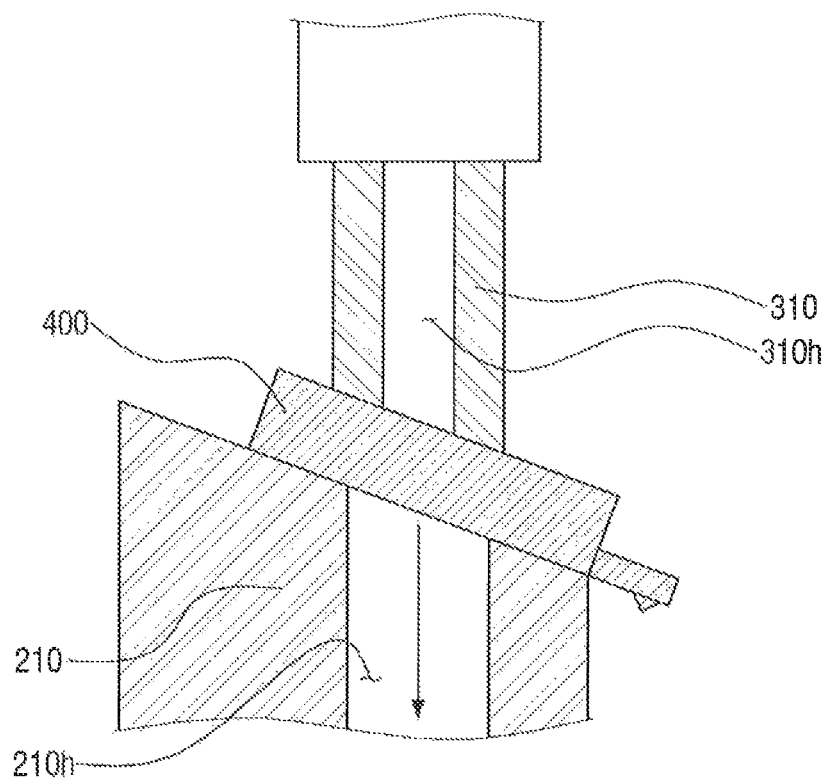

Referring to FIG. 12, the probe connector 310 and the probe 400 contact each other.

As the stage 100 is ascended, the second distance G2 is decreased, and the probe 400 is brought into contact with the probe connector 310.

The upper surface of the stage 100 may be ascended in the vertical direction. When the upper surface of the stage 100 is ascended, the object(s) disposed thereon are moved along the Z direction.

When the stacker 210, disposed on the stage 100, is ascended in the vertical direction, the second distance G2 may be decreased, and the probe 400 may contact the probe connector 310.

In an exemplary embodiment of the present inventive concept, only a portion of the plate 200, on which the stacker 210 is disposed, may be ascended.

In an exemplary embodiment of the present inventive concept, the upper surface of the stage 100 might not be ascended, but the upper surface of the plate 200, or the upper surface of the stacker 210 may be raised upward. For example, various elements of the probe exchanging apparatus may be ascended, as long as the probe 400 is ascended.

Alternatively, in an exemplary embodiment of the present inventive concept, the probe 400 may be maintained in position, while the probe connector 310 is descended. For example, the probe connector 310 may be moved downward in the vertical direction, reducing the second distance G2 and bringing the probe 400 and the probe connector 310 into contact with each other.

Further, the distance between the probe 400 and the probe connector 310 may be reduced by combining all the methods described above.

When the probe 400 and the probe connector 310 contact each other, the probe 400 may contact the end of with the second vacuum hole 310h. The second vacuum hole 310h may be completely sealed by the upper surface of the probe 400. For example, the body 410 of the probe 400 may entirely cover the second vacuum hole 310h.

Figure 13:
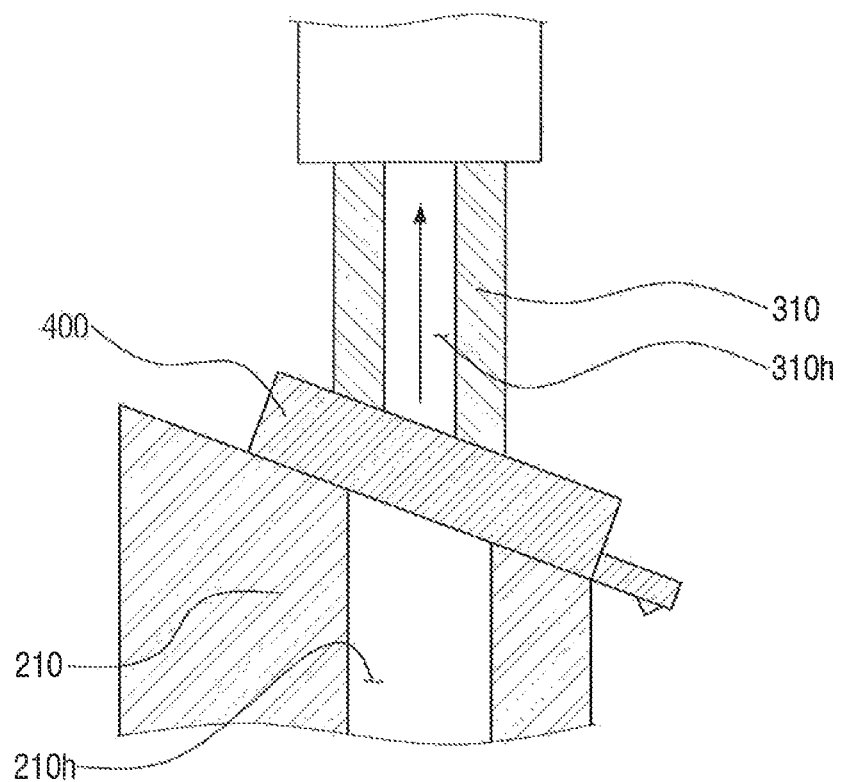

Referring to FIG. 13, the probe 400 may be connected to the probe connector 310.

The first vacuum hole 210h of the stacker 210 may stop sucking the probe 400. Accordingly, the probe 400 may be seated on the stacker 210, but the probe 400 is no longer fixed to the stacker 210 by the first vacuum hole 210h.

In the case when the connector is not the first vacuum hole 210h, the connector being the magnet or the holder, the probe 400 may be seated on the stacker 210, but the probe 400 will not be fixed to the stacker 210 by the magnet or the holder.

The second vacuum hole 310h of the probe connector 310 may create suction in air in an upward direction to secure the probe 400. The body 410 of the probe 400 may completely block the second vacuum hole 310h so that the probe 400 and the probe connector 310 may be fixed with each other.

The body 410 may have a larger upper surface area than the cross-sectional area of the second vacuum hole 310h so that the second vacuum hole 310h may be entirely covered by the body 410.

In an exemplary embodiment of the present inventive concept, a different connector may be used instead of the second vacuum hole 310h to fix the probe 400 to the probe connector 310. For example, the probe 400 may be fixed to the probe connector 310 using a magnet. The probe 400 may include a metal material and the metal material allows the probe 400 to be fixed to the probe connector 310 using the magnet. In this case, the magnet may be embedded within the probe connector 310.

Alternatively, in an exemplary embodiment of the present inventive concept, a holder may be included instead of the second vacuum hole 310h. The holder may be a mechanical apparatus that physically presses the probe 400 in the vertical axis, for example, in the upward direction toward the probe connector 310. The holder may include an elastic material such as spring, or the like. However, exemplary embodiments of the present inventive concept are not limited to the example given above.

Figure 14:
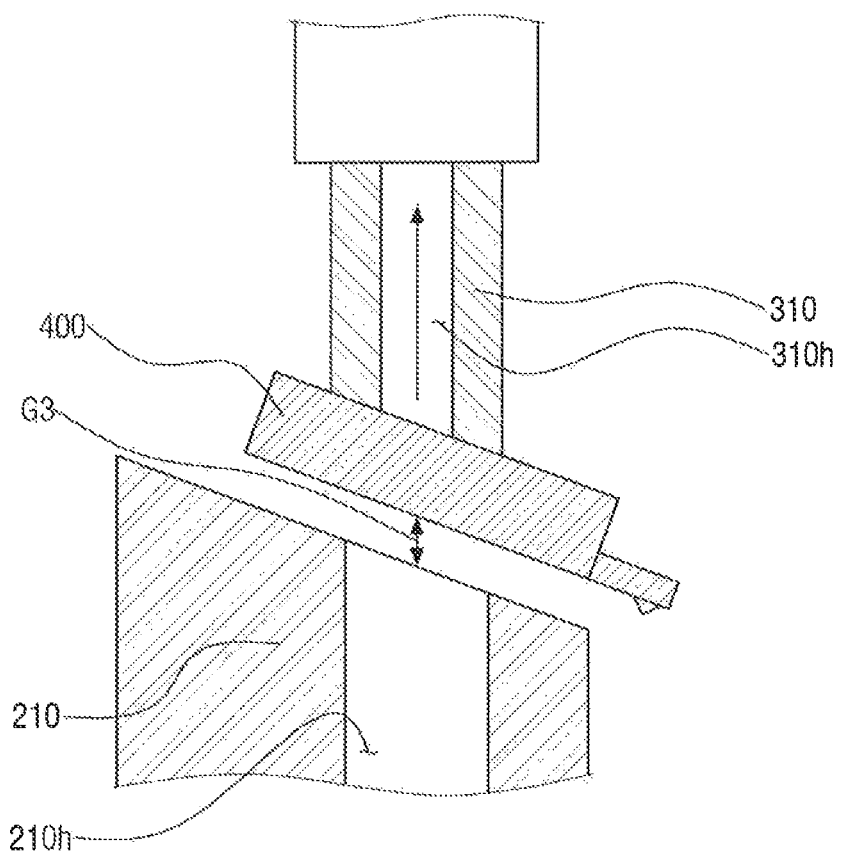

Referring to FIG. 14, the probe connector 310 may separate the probe 400 from the stacker 210.

When the probe connector 310 separates the probe 400 from the stacker 210, a third distance G3 may be created between the probe connector 310 and the probe 400. The distance between the probe connector 310 and the probe 400, as used herein, may refer to a distance between a lowermost portion of the probe connector 310 and the probe 400 in the vertical direction.

The third distance G3 may be smaller than the first distance G1 and the second distance G2. The third distance G3 may be a very small distance. The third distance G3 may be less than a height of the guide pattern 212 of the stacker 210, (e.g., less than a height difference between the upper surface of the stacker 210 and the upper surface of the guide pattern 212).

Accordingly, the side surface of the guide pattern 212 and the side surface of the probe 400 may be overlapped with each other horizontally.

The probe 400 and the stacker 210 may be separated from each other by the third distance G3, as the stage 100 is descended.

The upper surface of the stage 100 may be descended in the vertical direction, (e.g., in the Z direction). For example, the upper surface of the stage 100 may be descended so that the object on the stage 100 is moved in the Z direction.

Accordingly, the stacker 210 disposed on the stage 100 may be descended in the vertical direction to separate the probe 400 and the probe connector 310 by the third distance G3.

In an exemplary embodiment of the present inventive concept, only a portion of the upper surface of the plate 200 might be descended. Referring to FIG. 1, only a portion of the plate 200, disposed on the stage 100 where the stacker 210 is formed, might be descended.

In an exemplary embodiment of the present inventive concept, the upper surface of the stage 100 is not descended, but the upper surface of the plate 200, or the upper surface of the stacker 210 may be moved downward in the vertical axis (e.g., descended). For example, various elements of the probe exchanging apparatus may be moved, as long as the probe 400 is descended.

Alternatively, in an exemplary embodiment of the present inventive concept, the stacker 210 may be maintained in position, while the probe connector 310 is ascended. For example, the probe connector 310 may be movable in the vertical direction to separate the probe 400 and the stacker 210 by the third distance G3.

Further, the distance between the probe 400 and the stacker 210 may be decreased by combining all the methods described above.

Figure 15:
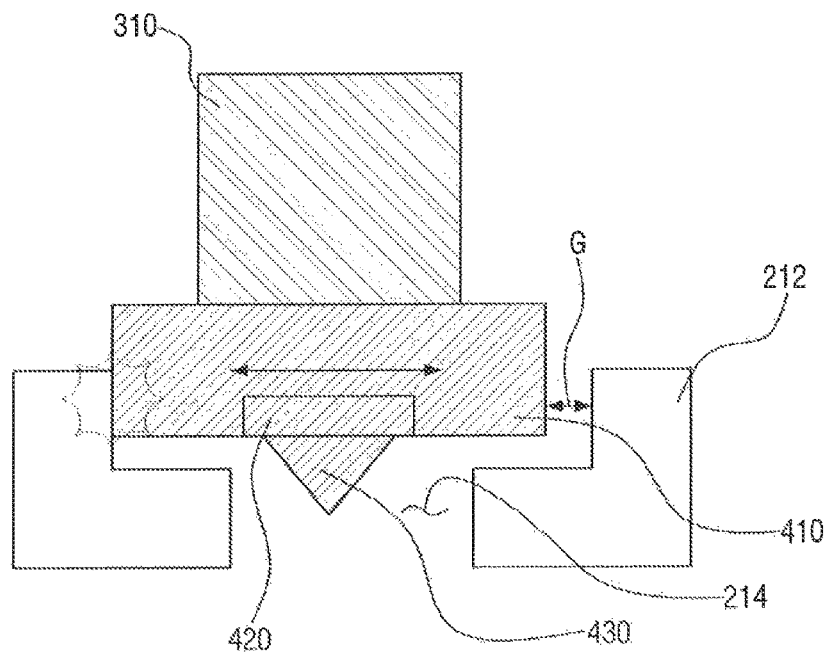

Referring to FIGS. 10 and 15 to 17, the alignment of the probe 400 on the probe connector 310 may be verified through the laser alignment unit 500. This may be done while the probe 400 is in physical contact with the stacker 210. FIG. 15 is a front view of the stacker 210, the probe 400, and the probe connector 310, viewed from a direction in which the cantilever part 420 and the tip 430 are disposed.

Referring to FIG. 15, the probe 400, while being in a connected state with the probe connector 310, may be aligned on the probe connector 310 by the stacker 210. The stacker 210 may include the guide pattern 212, protruding from the upper surface of the stacker 210. The upper surface of the guide pattern 212 may be disposed at an elevation (e.g., along the Z direction) that falls between the elevations of the upper and the lower surfaces of the probe 400.

In this state, as the stage 100 is moved in the X direction, the stacker 210 may be moved in the X direction, and the guide pattern 212 may be moved in the X direction. As the guide pattern 212 is moved in the X direction, the probe 400 may be brought into a physical contact with the guide pattern 212.

The connecting portion of the probe connector 310, (e.g., the second vacuum hole 310h) may exert a force on the probe 400 that keeps the probe 400 connected to the probe connector 310. However, the force exerted on the probe 400 by the probe connector 310 does not restrict the probe 400 from moving on the probe connector 310 in the horizontal plane.

When the probe 400 is moved by a guide pattern 212, one side surface of the probe 400 may be brought into a contact with the guide pattern 212, while another side surface is separated from another guide pattern 212 by a predetermined gap G.

To align the probe 400 on the probe connector 310, the height of the upper surface of the guide pattern 212 may be lower than the height of the upper surface of the body 410 of the probe 400. If the height of the upper surface of the guide pattern 212 is greater than the height of the upper surface of the body 410 of the probe 400, the probe connector 310 may contact the guide pattern 212. This may cause damage to the probe connector 310.

In an exemplary embodiment of the present inventive concept, rather than the movement in the X direction of the stage 100, the plate 200 or the stacker 210 may be moved in the X direction. For example, various elements may be moved in the X direction as long as the probe 400 is aligned on the probe connector 310.

Alternatively, in an exemplary embodiment of the present inventive concept, the probe 400 may be maintained in position, and the probe connector 310 may be moved in the X direction to align the probe 400 on the probe connector 310.

Further, the alignment of the probe 400 on the probe connector 310 may be achieved by a combination of one or more of the methods described above.

Figure 16:
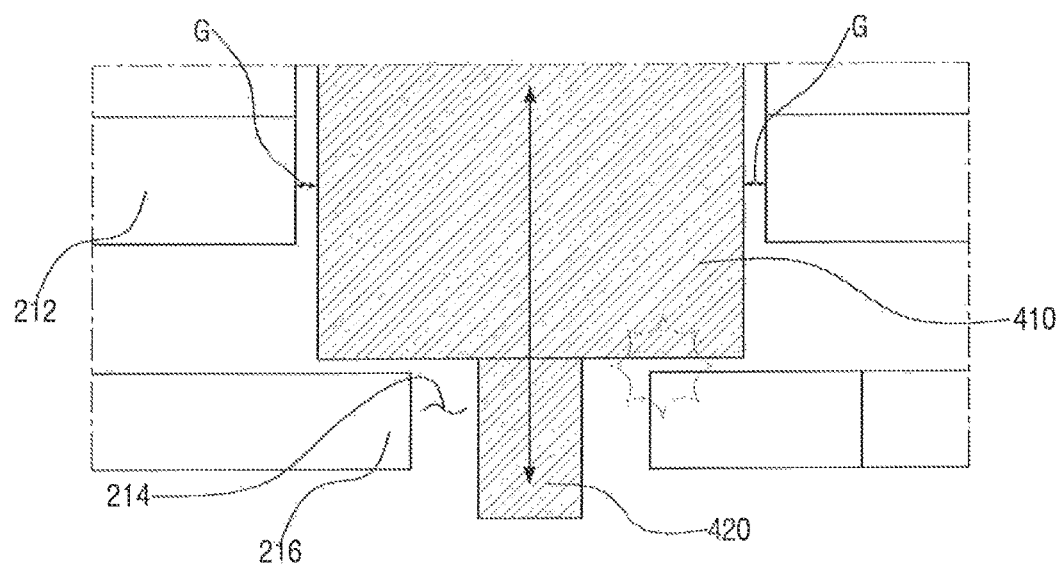

FIG. 16 is a top view of the stacker 210, the probe 400, and the probe connector 310 viewed from above. In FIG. 16, the probe 400 is moved along the Y direction.

Referring to FIG. 16, the probe 400, while being in a connected state with the probe connector 310, may be aligned by the stacker 210. The height of the upper surface of the supporting wall 216 may be greater in elevation (e.g., along the Z direction) than the elevation of the lower surface of the probe 400.

When the stage 100 is moved in the Y direction, the stacker 210 and the supporting wall 216 may be moved in the Y direction. As the supporting wall 216 is moved in the Y direction, the probe 400 may be brought into a physical contact with the supporting wall 216.

When the probe 400 is moved by the supporting wall 216, one side surface of the probe 400 may be brought into contact with the supporting wall 216.

In an exemplary embodiment of the present inventive concept, the guide pattern 212 may be formed on a portion corresponding to the supporting wall 216, e.g., on a rear surface of the probe 400. For example, the guide pattern 212 may be formed on the surface of the body 410 of the probe 400, for example, opposite the surface on which the cantilever part 420 is extended, to adjust the alignment of the probe 400 in the Y direction.

To align the probe 400, the elevation of the upper surface of the supporting wall 216 may be lower than that of the upper surface of the body 410 of the probe 400. If the height of the upper surface of the guide pattern 212 is greater than the height of the upper surface of the body 410, the probe connector 310 and the supporting wall 216 may contact each other. Thus, damage may be caused to the probe connector 310. However, exemplary embodiments of the present inventive concept are not limited thereto.

In an exemplary embodiment of the present inventive concept, rather than the stage 100 be moved horizontally, the plate 200 or the stacker 210 may be moved horizontally. For example, various elements of the probe exchanging apparatus may be moved, as long as the probe 400 is aligned on the probe connector 310.

Alternatively, in an exemplary embodiment of the present inventive concept, the probe 400 may be maintained in position, while the probe connector 310 is moved in the horizontal plane. The probe connector 310 may be moved in the horizontal plane to align the probe 400 on the probe connector 310.

Further, the probe 400 may be aligned on the probe connector 310 by combining all the methods described above.

Figure 17:
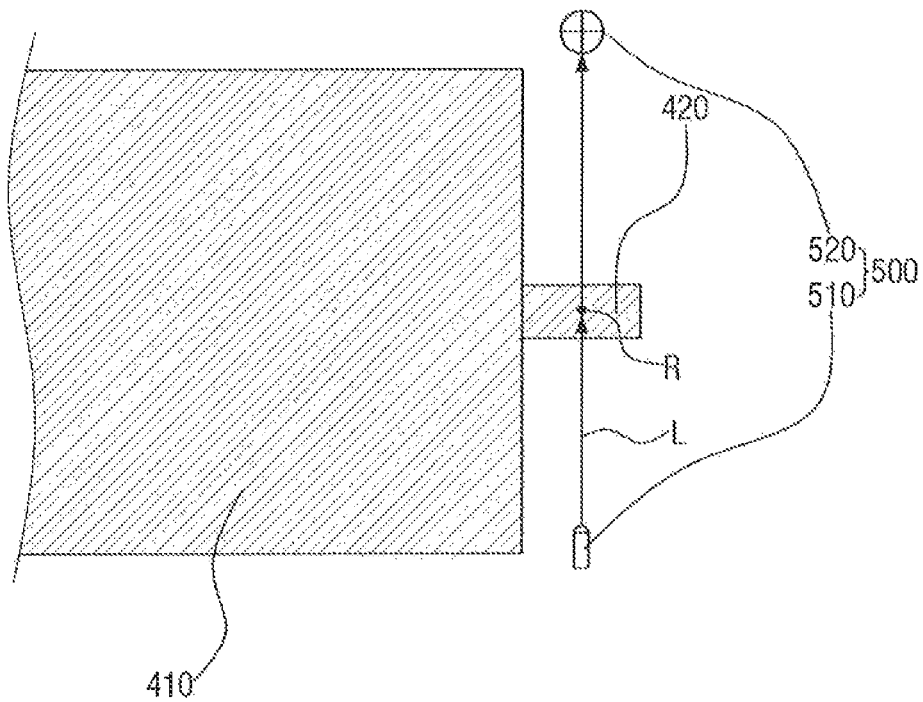

Referring to FIG. 17, the laser alignment unit 500 may be used to determine whether the probe 400 is aligned on the probe connector 310.

The laser alignment unit 500 may include a light emitter 510 and a light receiver 520.

The light emitter 510 may emit a laser beam L to the probe 400. The light emitter 510 may emit the laser beam L to an upper surface of the cantilever part 420, e.g., to a surface of the cantilever part 420 opposite to that on which the tip 430 is disposed. The laser beam L may be emitted onto a reflection point R on the cantilever part 420. The laser beam L may be reflected at the reflection point R and be detected by the light receiver 520.

The light receiver 520 may detect the reflected laser beam L and may determine an intensity reflected laser beam L. The intensity of the reflected laser beam L may be, for example, expressed in atomic units (a.u.). The reflected laser beam L includes the section of the laser beam L that travels from the light emitter 510 to the reflection point R, and the section of the laser beam L that travels from the reflection point R to the light receiver 520. The light receiver 520 is used to determine a magnitude of the intensity of the laser beam L based on the location of the reflection point R.

The location of the reflection point R may vary depending on the location of the cantilever part 420. The light emitter 520 and the light receiver 510, e.g., the laser alignment unit 500, may emit and detect the laser beam L, while being at a fixed position relative with the probe connector 310. An angle which the laser beam L forms with the horizontal plane from the light emitter 510 to the reflection point R may be the same as that between the reflection point R and the light receiver 520.

When the magnitude of the intensity of the laser beam L, detected by the light receiver 520, is constant over a range of distance between the laser alignment unit 500 and the probe 400, the probe 400 is aligned, e.g., disposed at the correct location on the probe connector 310. Accordingly, the magnitude of the intensity of the laser beam L may be used to verify whether the probe 400 and the probe connector 310 are correctly aligned.

Figure 18:
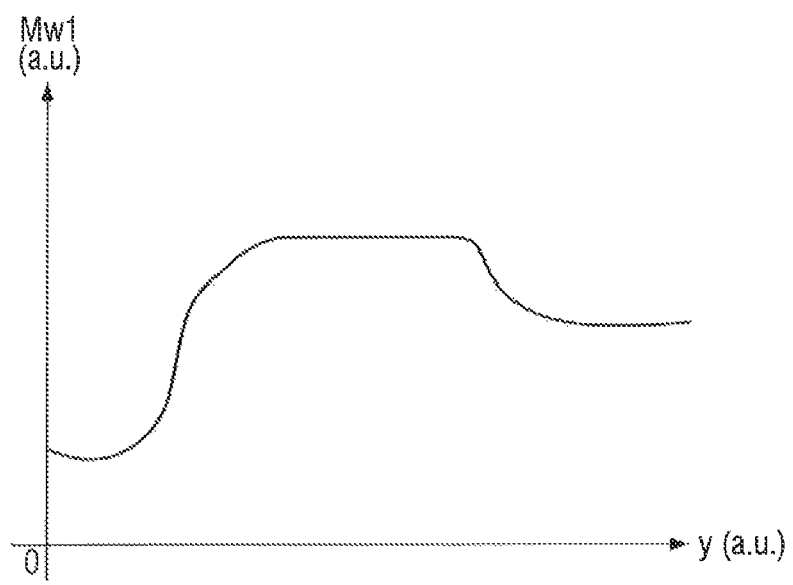

FIG. 18 is a graph illustrating the magnitude of the intensity of the laser beam L, measured by the light receiver 520, versus a distance between the cantilever part 420 and the light emitter 510. The y axis represents the distance between the cantilever part 420 and the light emitter 510, and the Mw1 axis represents a magnitude of the laser beam L measured by the light receiver 520.

The probe 400 and the probe connector 310 are aligned when the magnitude of the intensity of the laser beam L is at maximum. The light emitter 510 and the light receiver 520 may be disposed at predetermined locations on the probe arm 300. In addition, the emission angle of laser beam L may be predetermined.

According to FIG. 18, the maximum magnitude of the intensity of the laser beam L may occur at a given range of distance between the laser alignment unit 500 and the probe 400. Alternatively, the maximum magnitude of intensity of the laser beam L may have a peak value corresponding to a given distance between the laser alignment unit 500 and the probe 400. When the upper surface of the cantilever part 420 is flat, the intensity of the laser beam L may occur at a given range of distance between the laser alignment unit 500 and the probe 400, as illustrated in FIG. 18. In contrast, when the upper surface of the cantilever part 420 is convex or concave, the maximum magnitude of intensity of the laser beam L may have a peak value corresponding to a given distance between the laser alignment unit 500 and the probe 400. When the magnitude of the laser beam L has a peak value, the position of the probe 400 may be aligned with greater precision.

Referring back to FIG. 10, the result of such measurement at the laser alignment unit 500 may be transmitted to the stage 100. When it is determined from the result of measurement at the laser alignment unit 500 that the probe 400 is aligned accurately, the stage 100 might not move further. When it is determined from the result of measurement at the laser alignment unit 500 that the probe 400 is not aligned accurately, unlike the approach illustrated in FIGS. 15 and 17, the probe 400 may be moved horizontally, as described above, to align the probe 400 on the probe connector 310.

Alternatively, according an exemplary embodiment of the present inventive concept, the result of measurement at the laser alignment unit 500 may be used to move probe connector 310, instead of the stage 100. In such a case, the probe connector 310, instead of the stage 100, may be moved in the horizontal plane to complete the alignment of the probe 400.

An error may be generated in the position of replacement when there is a difference of material and shape between the probe 400 used for generating a marked image M of the camera 320 and the probe 400 being newly replaced. However, the probe exchanging apparatus and method, according an exemplary embodiment of the present inventive concept, can prevent such error. For example, an alignment error generated due to an image acquired by the camera 320 can be corrected using physical contact on the probe 400 (e.g., contact between the stacker 210 and the probe 400) to correctly align the probe 400 on the probe connector 310.

Further, a misalignment of the probe 400 can be corrected with movements of the laser alignment unit 500 and the stage 100 using the probe exchanging apparatus and method according an exemplary embodiment of the present inventive concept.

Further, as the laser alignment unit 500 performs verification of the alignment of the probe 400, the alignment of the probe 400 may be adjusted while the probe 400 is connected with the probe connector 310, e.g., without laying the probe 400 down (e.g., on the stacker 210), aligning the probe 400 on the stacker 210, and then connecting the probe 400 with the probe connector 310. As a result, a probe 400 may be quickly and efficiently aligned using a probe exchanging apparatus and/or method, according to an exemplary embodiment of the present inventive concept.

While the inventive concept has been particularly shown and described with reference to exemplary embodiments thereof, it will be apparent to those of ordinary skill in the art that various changes in form and detail may be made therein without departing from the spirit and scope of the present inventive concept.

What is claimed is:

1. An apparatus for exchanging a probe, comprising:
a stacker configured to receive a probe and to align the probe;
a probe connector connected to the probe; and
a laser alignment unit comprising a light emitter and a light receiver, wherein the light emitter is configured to emit a laser beam to the probe, and the light receiver is configured to detect the laser beam reflected by the probe, wherein the laser alignment unit is configured to detect when the probe is properly aligned on the probe connector using the light receiver, and the laser alignment unit is configured to stop moving the stacker when it is detected that the probe is properly aligned.

2. The apparatus of claim 1, wherein an upper surface of the stacker is inclined with respect to a first horizontal direction, and
the probe is disposed on the upper surface of the stacker.

3. The apparatus of claim 1, wherein the stacker comprises a guide pattern, the guide pattern protruding from an upper surface of the stacker, and
wherein the guide pattern contacts a side surface of the probe when the guide pattern is moved.

4. The apparatus of claim 1, wherein the stacker is configured to move in a first horizontal direction and in a second horizontal direction crossing the first horizontal direction, wherein each of the first and second horizontal directions is perpendicular to a vertical direction.

5. The apparatus of claim 1, wherein the stacker comprises a first vacuum hole, wherein an end of the first vacuum hole is connected to a lower surface of the probe to secure the probe to the stacker.

6. The apparatus of claim 1, wherein the probe connector comprises a second vacuum hole, wherein an end of the second vacuum hole is connected to an upper surface of the probe to secure the probe to the probe connector.

7. The apparatus of claim 1, wherein the stacker comprises a first connector configured to connect the stacker to the probe, and the probe connector comprises a second connector configured to connect the probe connector to the probe.

8. The apparatus of claim 7, wherein each of the first and second connectors comprises a vacuum hole, a magnet, or a holder.

9. The apparatus of claim 1, wherein the probe comprises a body, a cantilever part extending from the body, and a tip disposed adjacent to a first end of the cantilever part, wherein the cantilever part includes the first end and a second end opposite to the first end, the second end being connected to the body, and wherein the laser beam is reflected by the cantilever part.

10. An apparatus for exchanging a probe, comprising:

a stage configured to move in at least one direction;

a stacker fixed on the stage, the stacker comprising an upper surface, wherein the upper surface of the stacker includes a stepped portion, wherein the stepped portion is configured to contact a probe;

a probe connector connected to the probe; and a laser alignment unit comprising a light emitter and a light receiver configured to direct a laser beam to the probe, wherein the laser alignment unit is further configured to detect the laser beam reflected by the probe, and wherein the detected laser beam is used to determine a location of the probe, wherein the stage is configured to align the probe by moving the stage in the at least one direction using the detected laser beam, wherein moving the stage in the at least one direction causes the stepped portion to push the probe.

11. The apparatus of claim 10, further comprising a camera configured to acquire an image of the probe connector and the probe.

12. The apparatus of claim 11, wherein the stage or the probe connector is used to perform a first alignment of the probe on the probe connector based on a difference between a predetermined image and the acquired image, wherein the predetermined image illustrates a predetermined arrangement of the probe relative to the probe connector.

13. The apparatus of claim 12, wherein, after the first alignment, the stage performs a second alignment of the probe using the laser alignment unit.

14. The apparatus of claim 10, wherein an elevation of the stepped portion is greater than an elevation of a lower surface of the probe.

15. The apparatus of claim 1, wherein the laser alignment unit is connected to the probe connector.

16. An apparatus for exchanging a probe, comprising:

a stage;

a stacker disposed on the stage;

a camera;

a laser alignment unit; and a probe connector configured to receive a probe thereon, wherein the probe connector is further configured to allow the probe to move thereon, wherein the probe is movable to a predetermined location on the probe connector by moving either the stage or the probe connector, based on an image acquired by the camera or a laser measurement determined using the laser alignment unit.

17. The apparatus of claim 16, wherein the image acquired by the camera includes the probe and the probe connector in a current state, wherein a predetermined image includes the probe and the probe connector in an aligned state, and wherein a difference between the current state and the aligned state of the probe, relative to the probe connector, is used to slide the probe to the predetermined location.

18. The apparatus of claim 16, wherein the laser alignment unit is configured to reflect a laser beam off of the probe and to detect the laser beam reflected by the probe, wherein a location of the probe relative to the laser alignment unit is determined using the detected laser beam.

19. The apparatus of claim 16, wherein, when the stage is moved, a protrusion of the upper surface of the stacker directly contacts the probe.

20. The apparatus of claim 19, wherein the probe is tilted with respect to a horizontal axis.

* * * * *